United States Patent
Kato

(10) Patent No.: US 7,049,899 B2
(45) Date of Patent: May 23, 2006

(54) TEMPERATURE COMPENSATED PIEZOELECTRIC OSCILLATOR AND ELECTRONIC DEVICE USING THE SAME

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 125 days.

(21) Appl. No.: 10/741,169

(22) Filed: Dec. 19, 2003

(65) Prior Publication Data

US 2004/0189412 A1  Sep. 30, 2004

(30) Foreign Application Priority Data

Mar. 25, 2003 (JP) ............................. 2003-083363

(51) Int. Cl.
*H03B 5/32* (2006.01)
(52) U.S. Cl. ...................................... 331/176; 331/158
(58) Field of Classification Search ................ 331/158, 331/116 R, 176, 177 V
See application file for complete search history.

(56) References Cited

U.S. PATENT DOCUMENTS 5,481,229 A * 1/1996 Connell et al. ............. 331/158
5,898,345 A * 4/1999 Namura et al. ......... 331/177 V
2001/0017574 A1* 8/2001 Oka ....................... 331/116 R

FOREIGN PATENT DOCUMENTS

JP          2002-135053         5/2002

* cited by examiner

*Primary Examiner*—Joseph Chang
(74) *Attorney, Agent, or Firm*—Keating & Bennett, LLP

(57) ABSTRACT

A temperature compensated piezoelectric oscillator that is capable of reducing the deterioration of phase noise caused by electrical-current noise, and an electronic device using the temperature compensated piezoelectric oscillator is arranged such that a connection point of a first resistor and a second resistor, which are connected in series between an external frequency control terminal and ground, is connected to the cathode of a variable capacitance diode. Furthermore, a capacitor for bypassing current noise, in which the impedance at a frequency that is lower than the oscillation frequency is sufficiently low so as to be capable of bypassing electrical-current noise generated from the resistors to ground, is provided between the connection point of the resistors and the ground. Electrical-current noise applied to the variable capacitance diode can be reduced, and the phase noise of the oscillation signal can be reduced.

14 Claims, 6 Drawing Sheets

THERMISTOR

TEMPERATURE COMPENSATED PIEZOELECTRIC OSCILLATOR AND ELECTRONIC DEVICE USING THE SAME

BACKGROUND OF THE INVENTION

1. Field of the Invention

The present invention relates to a temperature compensated piezoelectric oscillator and an electronic device including the temperature compensated piezoelectric oscillator. More particularly, the present invention relates to a temperature compensated piezoelectric oscillator including a variable capacitance diode for varying the oscillation frequency, and to an electronic device including the temperature compensated piezoelectric oscillator.

2. Description of the Related Art

FIG. 6 shows a circuit diagram of a temperature compensated crystal oscillator, which is one type of conventional temperature compensated piezoelectric oscillator. In FIG. 6, only the main portions are shown. An example of the entirety of a known temperature compensated piezoelectric oscillator is disclosed in Japanese Unexamined Patent Application Publication No. 2002-135053.

In FIG. 6, a temperature compensated crystal oscillator 1 includes a thermistor network 2 formed of a circuit network composed of a transistor Q1 which is an active element for oscillation, a crystal vibrator X1 which is a piezoelectric vibrator that functions as a resonance circuit, a variable capacitance diode VD1, a resistor, and a thermistor, resistors R1 to R6, and capacitors C1 to C5. Furthermore, the temperature compensated crystal oscillator 1 includes power-supply terminals Vcc1 and Vcc2, an external frequency control terminal Vc, and an output terminal Po.

Here, the collector of the transistor Q1 is connected to the power-supply terminal Vcc1 and is connected to ground via the capacitor C4. The emitter thereof is connected to ground via both the resistor R1 and the capacitor C2. The base thereof is connected to one end of the crystal vibrator X1. The capacitor C4 is set so that the impedance becomes sufficiently low at the oscillation frequency in such a manner that the collector of the transistor Q1 is grounded at high frequencies at the oscillation frequency so as to cause the transistor Q1 to perform a collector grounding operation. The capacitor C1 is connected between the base and the emitter of the transistor Q1, and the capacitor C1, together with the transistor Q1, the capacitor C2, and the crystal vibrator X1, forms a Colpitts oscillation circuit. The base of the transistor Q1 is connected to the power-supply terminal Vcc1 via the resistor R2 and is connected to ground via the resistor R3. The emitter of the transistor Q1 is connected to the output terminal Po via the capacitor C3.

On the other hand, the cathode of the variable capacitance diode VD1 is connected to the other end of the crystal vibrator X1, and the anode thereof is connected to ground via the capacitor C5. The capacitor C5 is set in such a manner that the impedance becomes sufficiently low at the oscillation frequency in order to cause the anode of the variable capacitance diode VD1 to be high-frequency grounded at the oscillation frequency. For an ideal capacitor, the larger the electrostatic capacitance, the smaller the impedance becomes. However, since an actual capacitor contains parasitic inductance components, etc., it does not necessarily function as a capacitor at the frequency higher than or equal to the self-resonant frequency. Therefore, for the capacitor C5, a multilayer chip capacitor of 1000 pF, in which the self-resonant frequency is higher than approximately 20 MHz, which is the oscillation frequency of the temperature compensated crystal oscillator 1, is used. In this case, the impedance at the oscillation frequency becomes approximately 8Ω, and it is possible to provide the function of causing the anode of the variable capacitance diode VD1 to be grounded at the oscillation frequency.

The anode of the variable capacitance diode VD1 is connected to an external frequency control terminal Vc via the resistor R4, which is the first resistor, and is also connected to the ground via the resistor R5 which is the second resistor. In other words, the voltage of the external frequency control terminal Vc divided by the resistors R4 and R5 is applied to the anode of the variable capacitance diode VD1.

Then, the cathode of the variable capacitance diode VD1 is connected to the thermistor network 2 via the resistor R6. The thermistor network 2 is a three-terminal circuit network formed of resistors and thermistors, with one terminal (electrical-current input terminal) being connected to the power-supply terminal Vcc2, which has a voltage stability that is higher than that of the power-supply terminal Vcc1, another terminal (electrical-current output terminal) being connected to ground, and another terminal (voltage output terminal) being connected to the resistor R6. Then, a voltage such that the voltage applied from the power-supply terminal Vcc2 between the electrical-current input terminal and the electrical-current output terminal is divided by a resistor and a thermistor is output from the voltage output terminal. A bypass capacitor for eliminating noise in the power supply may be connected between the power-supply terminal Vcc2 and the ground. Since the crystal vibrator X1 and the cathode of the variable capacitance diode VD1 are connected before the resistor R6, DC electrical current does not flow through the resistor R6. Since the voltage stability of the power-supply terminal Vcc1 is sufficiently high, the electrical-current input terminal of the thermistor network 2 may be connected to the power-supply terminal Vcc1.

The temperature compensated crystal oscillator 1 configured as described above oscillates at a frequency which is almost determined by the electrostatic capacitances of the crystal vibrator X1, the capacitors C1 and C2, and the variable capacitance diode VD1, and an oscillation signal is output from the output terminal Po. The oscillation frequency varies according to the electrostatic capacitance of the variable capacitance diode VD1, in other words, the bias voltage applied between the cathode and the anode of the variable capacitance diode VD1. In the thermistor network 2, since the voltage to be output from the voltage output terminal varies with temperature, the cathode voltage of the variable capacitance diode VD1 varies, and the electrostatic capacitance of the variable capacitance diode VD1 varies, with the result that the oscillation frequency of the temperature compensated crystal oscillator 1 also varies. By forming the thermistor network 2 so that the variation of the output voltage of the thermistor network 2 nearly cancels the variation of the resonance frequency of the crystal vibrator X1 due to the temperature variation, the temperature compensated crystal oscillator 1 is able to maintain the oscillation frequency regardless of the temperature.

The anode voltage of the variable capacitance diode VD1 is such that the control voltage applied to the external frequency control terminal Vc is divided by the resistors R5 and R4. For this reason, also, by varying the control voltage, the electrostatic capacitance of the variable capacitance diode VD1 varies, and the frequency oscillation of the temperature compensated crystal oscillator 1 varies.

In the temperature compensated crystal oscillator used as a reference signal source in a mobile phone, the external frequency control terminal is used to correct the oscillation frequency during communication with the base station.

In the temperature compensated crystal oscillator 1, since the variable capacitance diode VD1 is used to vary the frequency, the following problems exist.

First, the cathode of the variable capacitance diode VD1 is connected to the thermistor network 2. The thermistor network 2 is a three-terminal circuit network formed of resistors and thermistors, in which the voltage applied between the electrical-current input terminal and the electrical-current output terminal is divided and is output so as to be applied to the cathode of the variable capacitance diode VD1. At this time, DC electrical current flows through the resistors and thermistors. When electrical current flows through the resistors (also including the thermistors), electrical-current noise having substantially 1/f frequency characteristics is generated, and this is applied to the cathode of the variable capacitance diode VD1. In some resistors, for example, thick-film resistors, the magnitude of the electrical-current noise generated as a result of electrical current flowing through the resistors is considerably greater than that of the thermal noise generated from the resistors. When such electrical-current noise is applied to the variable capacitance diode VD1, the oscillation signal is FM-modulated by this noise, and phase noise, particularly at low detuning frequencies of the oscillation signal, is reduced.

On the other hand, the anode of the variable capacitance diode VD1 is also connected to the connection point of the resistors R5 and R4. The resistors R5 and R4 are used to divide the voltage applied to the external frequency control terminal Vc and to apply the divided voltage to the anode of the variable capacitance diode VD1. Naturally, DC electrical current flows therethrough, and electrical-current noise occurs similarly to the case of the thermistor network 2, causing the phase noise of the oscillation signal to be reduced. Since the capacitor C5 connected between the anode and the ground of the variable capacitance diode VD1 is set so as to have a sufficiently low impedance at the oscillation frequency and the self-resonant frequency thereof is higher than a low frequency which affects the phase noise, it is not useful for bypassing and reducing the electrical-current noise at low frequencies.

Since electrical-current noise is proportional to the resistance value of the resistance network and the electrical current flowing therethrough, it is made proportional to the voltage applied to the resistance network. Electrical-current noise corresponding to the voltage of the cathode of the power-supply terminal Vcc2 is applied to the cathode of the variable capacitance diode VD1, and electrical-current noise corresponding to the voltage applied to the external frequency control terminal Vc is applied to the anode. If it is assumed that the voltage of the power-supply terminal Vcc2 and the voltage applied to the external frequency control terminal Vc are equal to each other, it is considered that the power of the electrical-current noise is greater by an amount equal to the square root of two (approximately 1.4 times greater) than the case where either one of them exists. Naturally, this causes the phase noise of the oscillation signal to be increased.

In the manner described above, the conventional temperature compensated piezoelectric oscillator experiences the problem of an increase of the phase noise, resulting from the electrical-current noise applied to the variable capacitance diode.

SUMMARY OF THE INVENTION

In order to overcome the problems described above, preferred embodiments of the present invention provide a temperature compensated piezoelectric oscillator that is capable of reducing an increase of phase noise caused by electrical-current noise, and an electronic device including the novel temperature compensated piezoelectric oscillator.

According to a preferred embodiment of the present invention, a temperature compensated piezoelectric oscillator includinges an active element for oscillation, a piezoelectric vibrator connected to the active element, a variable capacitance diode connected to the piezoelectric vibrator, a temperature compensation circuit connected to one end of the variable capacitance diode, and an external frequency control terminal for varying the oscillation frequency by applying a voltage to the variable capacitance diode, wherein the external frequency control terminal is connected to ground via a first resistor and a second resistor in series, and the connection point of the first resistor and the second resistor is connected to the other end of the variable capacitance diode, and wherein a capacitor for bypassing current noise is provided between the connection point of the first resistor and the second resistor and ground, the impedance at a frequency lower than the oscillation frequency being sufficiently low so as to be capable of bypassing electrical-current noise generated from the first resistor and the second resistor to ground.

Alternatively, a capacitor for bypassing current noise is provided between the voltage output terminal of the temperature compensated circuit and ground, the impedance at a frequency that is lower than the oscillation frequency being sufficiently low so as to be capable of bypassing electrical-current noise generated from the temperature compensated circuit to ground.

Current-noise bypassing capacitors may be provided both between the connection point of the first resistor and the second resistor and ground, and between the voltage output terminal of the temperature compensated circuit and ground.

The self-resonant frequency of the current-noise bypassing capacitor is preferably lower than the oscillation frequency.

To put it in another way, the temperature compensated piezoelectric oscillator may be used as a reference signal source of a PLL circuit, and in the current-noise bypassing capacitor, the impedance at a frequency lower than a loop bandwidth of the PLL circuit is preferably sufficiently low so as to be capable of bypassing electrical-current noise to ground.

The electronic device of another preferred embodiment of the present invention includes a temperature compensated piezoelectric oscillator described above.

As a result of being formed in the manner described above, in the voltage-controlled oscillator of various preferred embodiments of the present invention, phase noise is significantly reduced.

Also, in the electronic device of a preferred embodiment of the present invention, by using the voltage-controlled oscillator of various preferred embodiments of the present invention, performance is greatly improved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
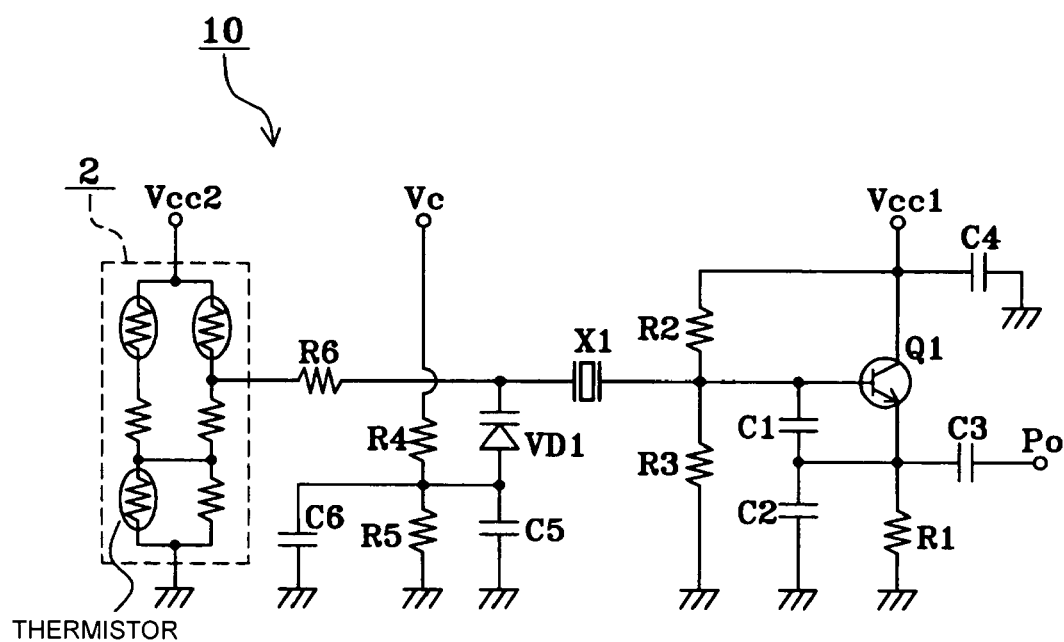
FIG. 1 is a circuit diagram showing a preferred embodiment of a temperature compensated piezoelectric oscillator of the present invention.
Figure 6:
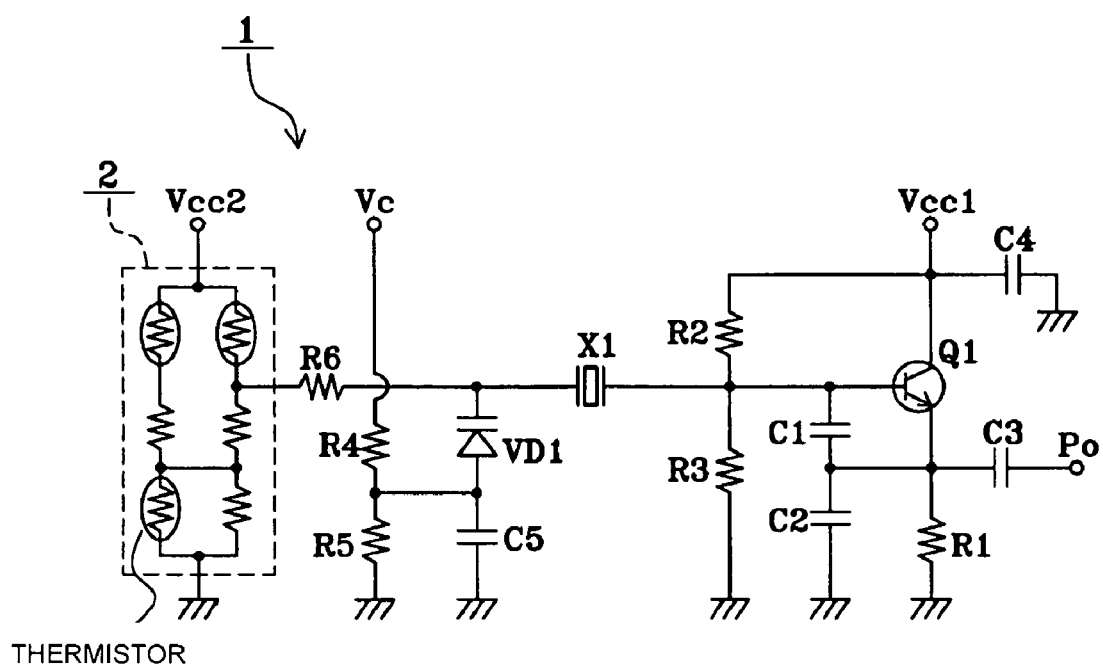
FIG. 6 is a circuit diagram showing a conventional temperature compensated piezoelectric oscillator.

FIG. 1 shows a circuit diagram of a preferred embodiment of a temperature compensated piezoelectric oscillator of the present invention. Components in FIG. 1, which are identical or similar to those in FIG. 6, are designated with the same reference numerals, and accordingly, descriptions thereof are omitted.

In a temperature compensated piezoelectric oscillator 10 shown in FIG. 1, the connection point of a resistor R4 which is a first resistor and a resistor R5 which is a second resistor is connected to ground via a capacitor C6. Whereas the capacitor C5 causes the anode of the variable capacitance diode VD1 to be grounded at the oscillation frequency in the manner described above, a capacitor C6 is arranged such that an electrostatic capacitance is large, the self-resonant frequency is lower than the oscillation frequency, and the impedance at a low frequency is sufficiently low. More specifically, for example, a multilayer chip capacitor having outer dimensions of, for example, approximately 1.6 mm×0.8 mm and an electrostatic capacitance of, for example, about 2.2 µF, or a cylindrical electrolytic capacitor of, for example, about 47 µF is preferably used. The self-resonant frequency of such a multilayer chip capacitor and electrolytic capacitor is approximately several 100 kHz or several 10 kHz, which is lower than approximately 20 MHz of the oscillation frequency, but with respect to such a low frequency as several kHz, which becomes problematic for use as a detuning frequency of phase noise, a sufficiently low impedance of approximately several 10Ω or several Ω is produced. The remaining configuration is preferably substantially the same as that of the conventional temperature compensated piezoelectric oscillator 1.

In the temperature compensated piezoelectric oscillator 10 configured as described above, since the cathode of the variable capacitance diode VD1 is connected to the thermistor network 2, electrical-current noise generated at the thermistor network 2 is applied to the cathode of the variable capacitance diode VD1 as in the conventional case. Since the electrical-current noise generated at the thermistor network 2 corresponds to the voltage of the power-supply terminal Vcc2, there is no difference from the case of the conventional temperature compensated piezoelectric oscillator. However, since the electrical-current noise generated from the resistors R4 and R5 due to the electrical current which flows from the external frequency control terminal Vc to a ground via the resistors R4 and R5 is bypassed to the ground by the capacitor C6, hardly any electrical-current noise is applied to the anode of the variable capacitance diode VD1. For this reason, in the temperature compensated piezoelectric oscillator 10, the electrical-current noise applied to the variable capacitance diode VD1 is reduced when compared to the temperature compensated piezoelectric oscillator 1, with the result that phase noise of the oscillation signal is reduced.

Moreover, the connection point of the resistors R4 and R5 is the anode of the variable capacitance diode VD1, and the anode of the variable capacitance diode VD1 is originally connected to a ground via the capacitor. Therefore, the connection of the capacitor C6 does not affect the characteristics other than the phase noise of the temperature compensated piezoelectric oscillator 10. That is, this means that the addition of one capacitor C6 makes it possible to reduce the phase noise, and the increase of the costs and the shape due to an increased number of parts can be minimized.

Figure 2:
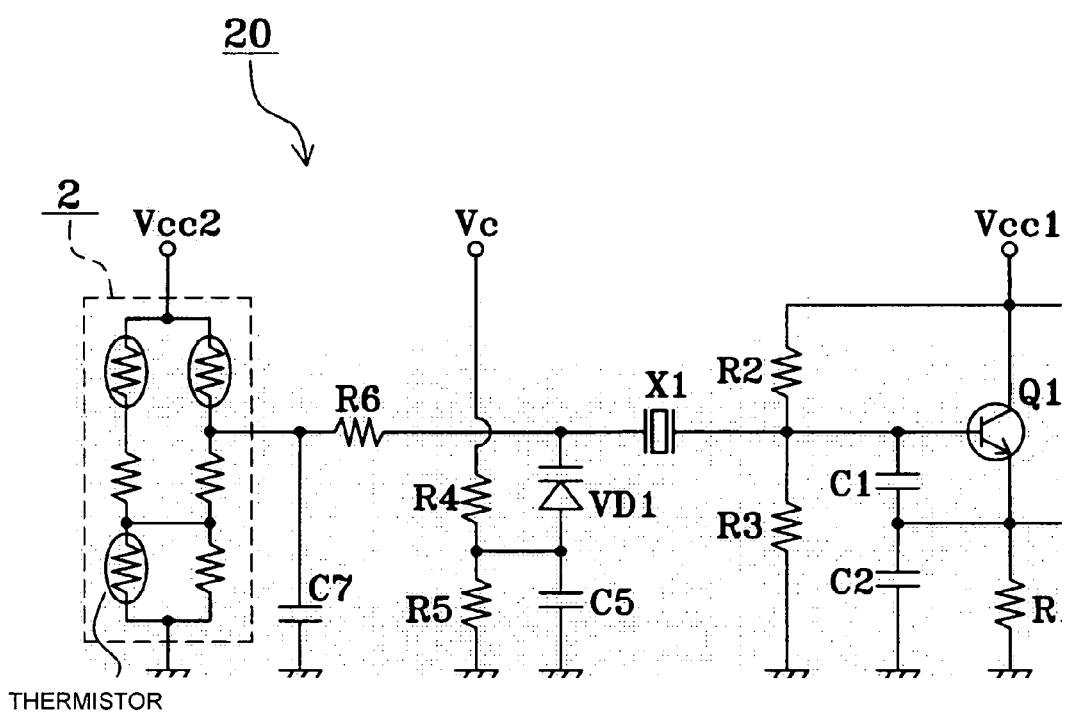
FIG. 2 is a circuit diagram of another preferred embodiment of a temperature compensated piezoelectric oscillator of the present invention.

FIG. 2 shows a circuit diagram of another preferred embodiment of a temperature compensated piezoelectric oscillator of the present invention. Components in FIG. 2, which are identical or similar to those in FIG. 6, are designated with the same reference numerals, and accordingly, descriptions thereof are omitted.

In a temperature compensated piezoelectric oscillator 20 shown in FIG. 2, a capacitor C7 is connected between the voltage output terminal of the thermistor network 2 and a ground. The capacitor C7 has characteristics similar to those of the capacitor C6 of the temperature compensated piezoelectric oscillator 10 shown in FIG. 1, such that the electrostatic capacitance is large, the self-resonant frequency is lower than the oscillation frequency, and the impedance at a low frequency is sufficiently low. The type and the capacitance values of the capacitor are preferably the same as that of the capacitor C6. The remaining configuration is preferably the same as that of the conventional temperature compensated piezoelectric oscillator 1.

In the temperature compensated piezoelectric oscillator 10 configured as described above, since the anode of the variable capacitance diode VD1 is connected to the resistors R4 and R5, electrical-current noise generated at the resistors R4 and R5 is applied to the anode of the variable capacitance diode VD1 as in the conventional case. Since the electrical-current noise generated at the resistors R4 and R5 corresponds to the voltage of the external frequency control terminal Vc, there is no difference from the case of the conventional temperature compensated piezoelectric oscillator. However, since the electrical-current noise generated by the electrical current flowing through the thermistor network 2 is bypassed to a ground by the capacitor C7, hardly any electrical-current noise is applied to the cathode of the variable capacitance diode VD1. For this reason, in the temperature compensated piezoelectric oscillator 20, the electrical-current noise applied to the variable capacitance diode VD1 is reduced when compared to the temperature compensated piezoelectric oscillator 1, with the result that the phase noise of the oscillation signal is reduced.

Furthermore, since the mere addition of one capacitor C7 makes it possible to reduce phase noise, the increase of the costs and the shape due to an increased number of parts can be minimized.

In the temperature compensated piezoelectric oscillator 20, since the capacitor C7 is connected to the voltage output terminal of the thermistor network, it is not directly connected to the cathode of the variable capacitance diode VD1. That is, the resistor R6 exists therebetween. The reason for this is that, if the capacitor C7 is directly connected to the cathode of the variable capacitance diode VD1, this is connected, as a high-frequency impedance, to the resonance circuit, exerting an influence on characteristics other than the phase noise of the temperature compensated piezoelectric oscillator 20. The resistor R6 only functions to cut off at high frequencies, the section between the thermistor network 2 and the resonance circuit, and electrical current does not flow therethrough. Therefore, electrical-current noise is not generated therefrom. For this reason, it is not necessary for the capacitor C7 to be directly connected to the cathode of the variable capacitance diode VD1, and it suffices to connect the capacitor C7 to the voltage output terminal of the thermistor network 2.

Figure 3:
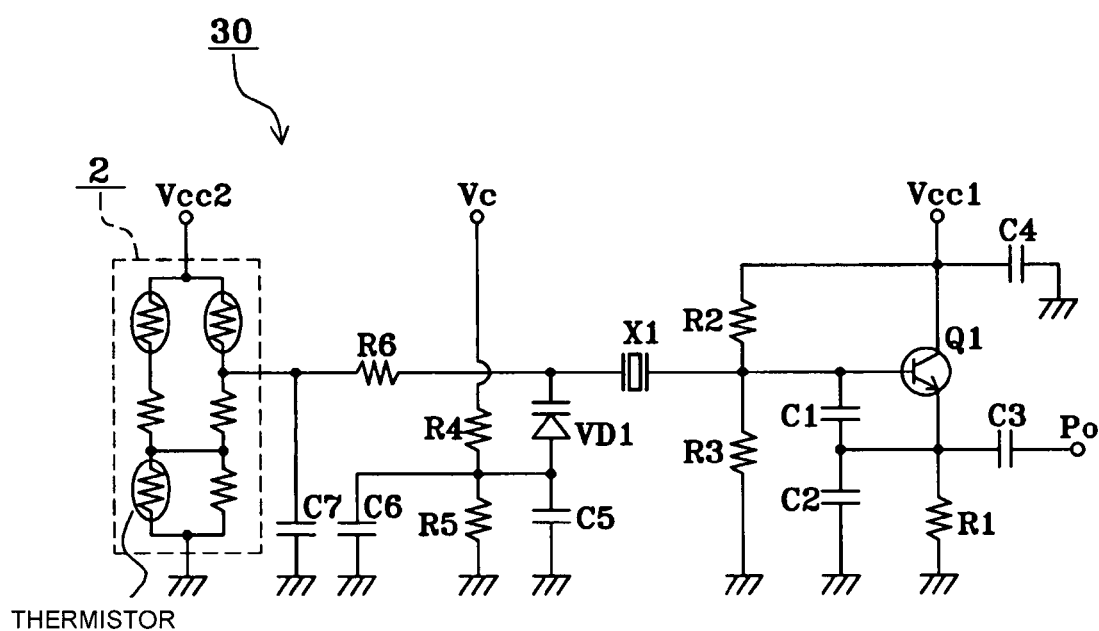
FIG. 3 is a circuit diagram showing another preferred embodiment of a temperature compensated piezoelectric oscillator of the present invention.

FIG. 3 shows a circuit diagram of another preferred embodiment of a temperature compensated piezoelectric oscillator of the present invention. Components in FIG. 3, which are identical or similar to those in FIG. 1 or 2, are designated with the same reference numerals, and accordingly, descriptions thereof are omitted.

A temperature compensated piezoelectric oscillator 30 shown in FIG. 3 preferably has the features of both the temperature compensated piezoelectric oscillators 10 and 20. That is, the connection point of the resistors R4 and R5 is connected to a ground via the capacitor C6, and moreover, the capacitor C7 is connected between the voltage output terminal of the thermistor network 2 and the ground. The remaining configuration is preferably the same as that of the temperature compensated piezoelectric oscillators 10 and 20.

In the temperature compensated piezoelectric oscillator 30 configured as described above, hardly any electrical-current noise is applied to both the anode and the cathode of the variable capacitance diode VD1. For this reason, in the temperature compensated piezoelectric oscillator 30, the electrical-current noise applied to the variable capacitance diode VD1 is further reduced when compared to the temperature compensated piezoelectric oscillators 10 and 20, with the result that the phase noise of the oscillation signal is further reduced.

Here, Table 1 shows the presence or absence of the capacitors C6 and C7 of the results of the measurements of the relationship between the capacitance values and the phase noise of the oscillation signal in the temperature compensated piezoelectric oscillators 10, 20, and 30. In practice, however, regarding the temperature compensated piezoelectric oscillators 10 and 20, measurements were performed in such a manner that the capacitor C6 or C7 was not used in the temperature compensated piezoelectric oscillator 30 and the value was set to zero. For the capacitance values of the capacitors C6 and C7, two values, that is, approximately 2.2 µF and approximately 47 µF, were used, and for noise measurement points (detuning frequencies), five points, that is, approximately 1 Hz, 10 Hz, 100 Hz, 1 kHz, and 10 kHz, were used.

TABLE 1

| | | Phase Noise [dBc/Hz] | | | | |
|---|---|---|---|---|---|---|
| C6 | C7 | @ 1 Hz | @ 10 Hz | @ 100 Hz | @ 1 kHz | @ 10 kHz |
| 0 | 0 | −53 | −88 | −119 | −146 | −151 |
| 47 µF | 0 | −66 | −98 | −128 | −149 | −151 |
| 2.2 µF | 0 | −56 | −93 | −126 | −148 | −151 |

TABLE 1-continued

| | | Phase Noise [dBc/Hz] | | | | |
|---|---|---|---|---|---|---|
| C6 | C7 | @ 1 Hz | @ 10 Hz | @ 100 Hz | @ 1 kHz | @ 10 kHz |
| 0 | 2.2 µF | −53 | −90 | −120 | −146 | −151 |
| 0 | 47 µF | −55 | −91 | −120 | −146 | −151 |
| 2.2 µF | 47 µF | −64 | −102 | −130 | −149 | −151 |

@ x Hz(x = 1, 10, 100, 1k, or 10k) means a detuning frequency.

It can be seen from Table 1 that, when both the capacitors C6 and C7 are provided, −102 dBc/Hz at the detuning frequency 10 Hz, −130 dBc/Hz at 100 Hz, −149 dBc/Hz at 1 kHz, and phase noise is reduced more than in the case of other conditions. Furthermore, even when only either one of them is provided, phase noise is reduced when compared to the case where none is provided. This reveals that the provision of the capacitors C6 and C7 so as to cause hardly any electrical-current noise to be applied to a varactor diode has the effect of reducing the phase noise of the oscillation signal.

Figure 4:
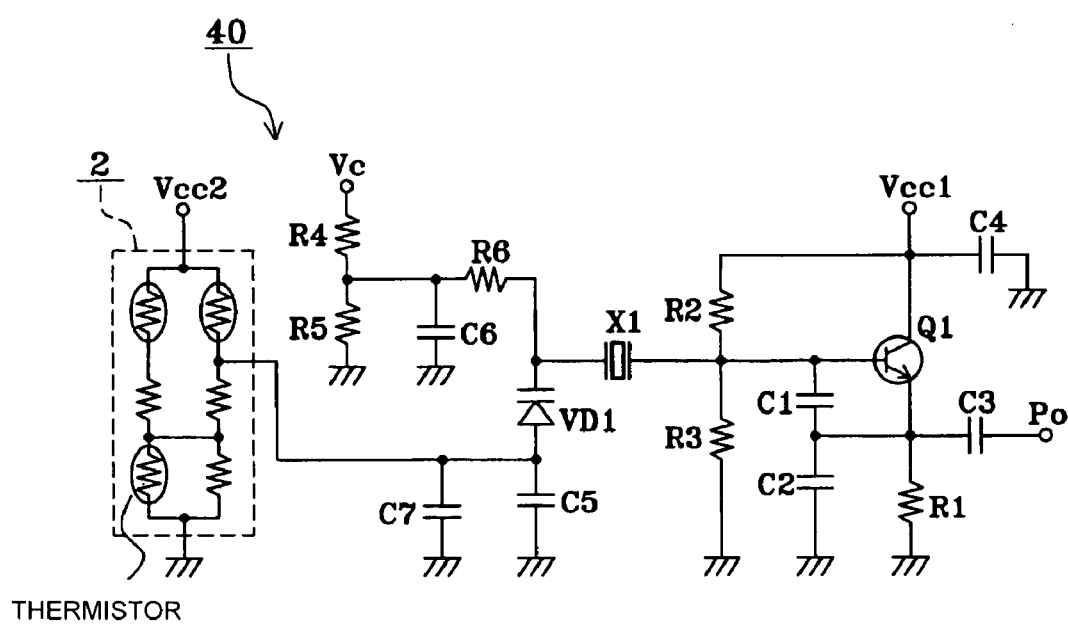
FIG. 4 is a circuit diagram showing another preferred embodiment of a temperature compensated piezoelectric oscillator of the present invention.

FIG. 4 is a circuit diagram showing another preferred embodiment of a temperature compensated piezoelectric oscillator of the present invention. Components in FIG. 4, which are identical or similar to those in FIG. 3, are designated with the same reference numerals, and accordingly, descriptions thereof are omitted.

In a temperature compensated piezoelectric oscillator 40 shown in FIG. 4, when compared to the temperature compensated piezoelectric oscillator 30, the roles of the anode and the cathode of the variable capacitance diode VD1 are reversed. That is, the voltage output terminal of the thermistor network 2 is directly connected to the anode of the variable capacitance diode VD1, and the connection point of the resistors R4 and R5 is connected to the cathode of the variable capacitance diode VD1 via the resistor R6. The capacitor C7 is connected between the voltage output terminal of the thermistor network 2 and the ground in a manner similar to the temperature compensated piezoelectric oscillator 30. Furthermore, the connection point of the resistors R4 and R5 is connected to a ground via the capacitor C6 in a manner similar to the temperature compensated piezoelectric oscillator 30. The remaining configuration is preferably substantially the same as that of the temperature compensated piezoelectric oscillator 30.

Also, in the temperature compensated piezoelectric oscillator 40 configured as described above, the fact that hardly any electrical-current noise is applied to both the anode and the cathode of the variable capacitance diode VD applies the same to the temperature compensated piezoelectric oscillator 30. For this reason, also, in the temperature compensated piezoelectric oscillator 40, electrical-current noise applied to the variable capacitance diode VD1 is reduced similarly to the temperature compensated piezoelectric oscillator 30, with the result that phase noise of the oscillation signal is reduced.

In the temperature compensated piezoelectric oscillator 40, the voltage applied to the cathode of the variable capacitance diode VD1 is lower than the voltage of the external frequency control terminal Vc. Since the voltage of the external frequency control terminal Vc sometimes becomes a comparatively low voltage, there are cases in which the voltage applied to the cathode becomes insufficient. In such a case, a resistor may be provided between the connection point of the resistors R4 and R5 and the power-supply terminal Vcc2 so that the voltage applied to the cathode of the variable capacitance diode VD1 is increased to value that is higher than the voltage of the external frequency control terminal Vc. In this case, the DC electrical current flows from the power-supply terminal Vcc2 to the external frequency control terminal Vc. Also, the same applies to this case in that electrical-current noise which flows from the connection point of the resistors R4 and R5 to the cathode of the variable capacitance diode VD1, and similarly, phase noise is reduced by the capacitor C6.

Furthermore, also, in the temperature compensated piezoelectric oscillator 40, a circuit configuration having either one of the capacitors C6 and C7 may be used. Also, in that case, substantially the same operational effects can be obtained even though the operational effects are not in such a degree as that having both of the capacitors C6 and C7.

In each of the above-described preferred embodiments, the anode of the variable capacitance diode VD1 is preferably connected to ground via the capacitor C5. In addition, a configuration exists in which a resistor is further connected to the capacitor C5 for the purpose of adjusting the temperature compensation characteristics of the oscillation frequency. Also, in such a case, since DC electrical current does not flow through this resistor and electrical-current noise is not generated, the provision of the capacitors C6 and C7 makes it possible to obtain exactly the same operational effects as those in each of the above-described preferred embodiments.

In each of the above-described preferred embodiments, a crystal vibrator is preferably used as the piezoelectric vibrator, but the vibrator is not limited to this example. Another piezoelectric vibrator, such as a vibrator using piezoelectric ceramics, may be used, and similar operational effects can be obtained.

Figure 5:
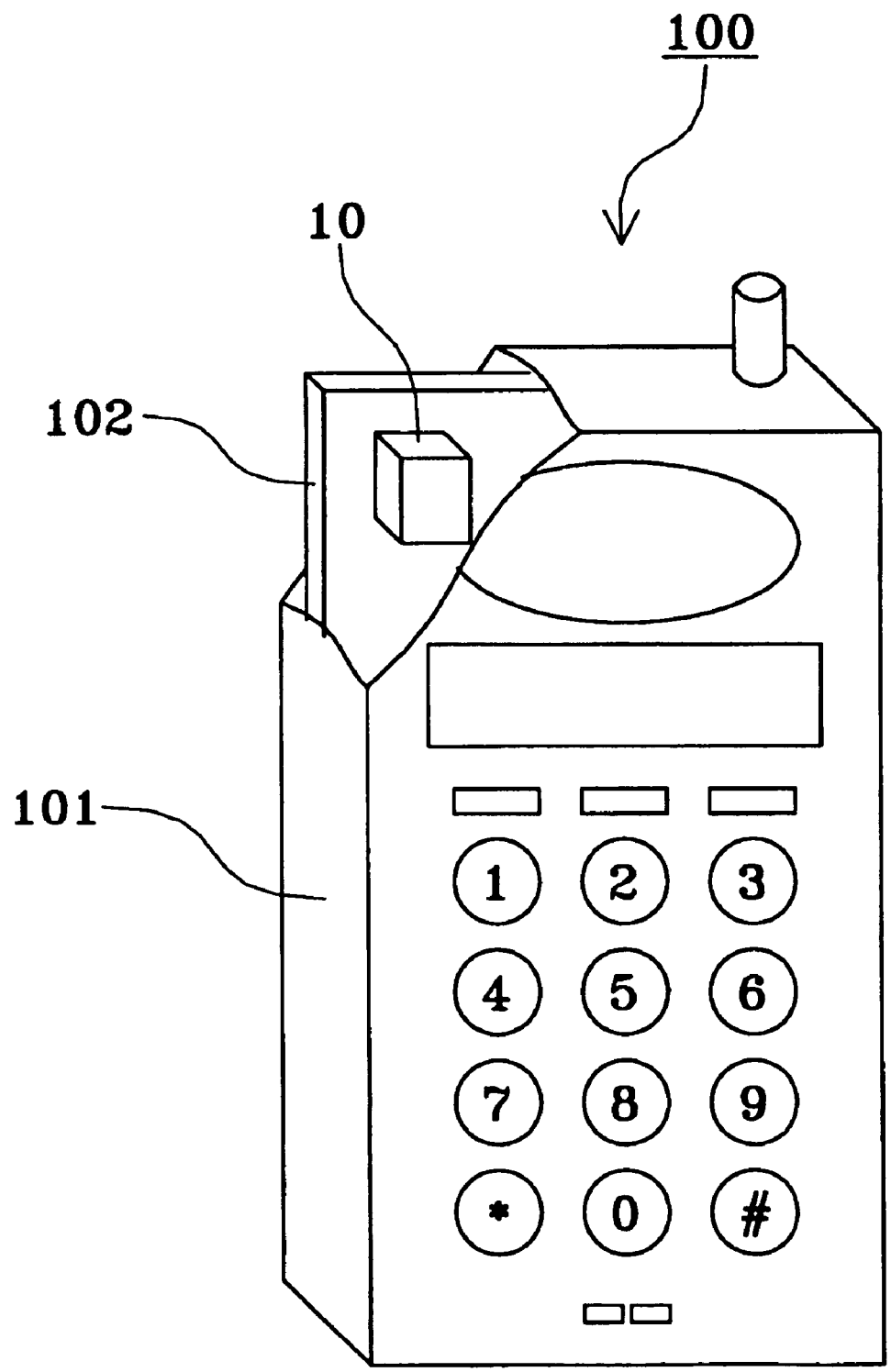
FIG. 5 is a perspective view showing a preferred embodiment of an electronic device of the present invention.

FIG. 5 shows a perspective view of an electronic device according to another preferred embodiment of the present invention. In FIG. 5, a mobile phone 100, which is one of electronic devices, includes a housing 101, a printed substrate 102 arranged inside the housing 101, and a temperature compensated crystal oscillator 10, which is a voltage-controlled oscillator of various preferred embodiments of the present invention, implemented as a reference signal source on the printed substrate 102.

In the mobile phone 100 configured as described above, since the temperature compensated crystal oscillator 10 is used, the phase noise of the reference signal source can be maintained at a low state, and the performance can be improved.

In FIG. 5, the mobile phone is shown as an electronic device, but the electronic device is not limited to a mobile phone. Any type may be used as long as the temperature compensated piezoelectric oscillator of various preferred embodiments of the present invention is used.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A temperature compensated piezoelectric oscillator comprising:
    an active oscillation element;
    a piezoelectric vibrator connected to the active oscillation element;
    a variable capacitance diode connected to the piezoelectric vibrator;
    a temperature compensation circuit connected to one end of the variable capacitance diode; and
    an external frequency control terminal for varying an oscillation frequency of the active oscillation element by applying a voltage to said variable capacitance diode; wherein
    said external frequency control terminal is connected to ground via a first resistor and a second resistor in series, and a connection point of said first resistor and said second resistor is connected to the other end of said variable capacitance diode;
    a first capacitor is provided between the connection point of said first resistor and said second resistor and ground; and
    an impedance of the first capacitor at a frequency lower than the oscillation frequency of the active oscillation element is sufficiently low so as to be capable of bypassing electrical-current noise generated from said first resistor and said second resistor to ground.

2. A temperature compensated piezoelectric oscillator according to claim 1, wherein the self-resonant frequency of said current-noise bypassing capacitor is lower than the oscillation frequency.

3. A temperature compensated piezoelectric oscillator according to claim 1, wherein said temperature compensated piezoelectric oscillator defines a reference signal source of a PLL circuit, and in said current-noise bypassing capacitor, the impedance at a frequency lower than a loop bandwidth of said PLL circuit is sufficiently low so as to be capable of bypassing electrical-current noise to ground.

4. An electronic device comprising a temperature compensated piezoelectric oscillator according to claim 1.

5. A temperature compensated piezoelectric oscillator according to claim 1, further comprising a second capacitor provided between the other end of the variable capacitance diode and ground; wherein
    the impedance of the second capacitor is such that the variable capacitance diode is grounded at the oscillation frequency of the active oscillation element.

6. A temperature compensated piezoelectric oscillator comprising:
    an active oscillation element;
    a piezoelectric vibrator connected to the active oscillation element;
    a variable capacitance diode connected to the piezoelectric vibrator;
    a temperature compensation circuit connected to one end of the variable capacitance diode by an output terminal;
    an external frequency control terminal for varying an oscillation frequency of the active oscillation element by applying a voltage to said variable capacitance diode;
    a first capacitor provided between the output terminal of said temperature compensation circuit and ground; and
    a second capacitor provided between the other end of the variable capacitance diode and ground.

7. A temperature compensated piezoelectric oscillator according to claim 6, wherein the self-resonant frequency of said current-noise bypassing capacitor is lower than the oscillation frequency.

8. A temperature compensated piezoelectric oscillator according to claim 6, wherein said temperature compensated piezoelectric oscillator defines a reference signal source of a PLL circuit, and in said current-noise bypassing capacitor, the impedance at a frequency lower than a loop bandwidth of said PLL circuit is sufficiently low so as to be capable of bypassing electrical-current noise to ground.

9. An electronic device comprising a temperature compensated piezoelectric oscillator according to claim 6.

10. A temperature compensated piezoelectric oscillator according to claim 6, wherein an impedance of the first capacitor at a frequency lower than the oscillation frequency of the active oscillation element is sufficiently low so as to be capable of bypassing electrical-current noise generated from the temperature compensated circuit; and
    an impedance of the second capacitor is such that the variable capacitance diode is grounded at the oscillation frequency of the active oscillation element.

11. A temperature compensated piezoelectric oscillator comprising:
    an active oscillation element;
    a piezoelectric vibrator connected to the active oscillation element;
    a variable capacitance diode connected to the piezoelectric vibrator;
    a temperature compensation circuit connected to one end of the variable capacitance diode; and
    an external frequency control terminal for varying an oscillation frequency of the active oscillation element by applying a voltage to said variable capacitance diode; wherein
    said external frequency control terminal is connected to ground via a first resistor and a second resistor in series, and a connection point of said first resistor and said second resistor is connected to the other end of said variable capacitance diode;
    a current-noise bypassing capacitor is provided between the connection point of said first resistor and said second resistor and ground, an impedance at a frequency lower than the oscillation frequency being sufficiently low so as to be capable of bypassing electrical-current noise generated from said first resistor and said second resistor to ground; and
    a capacitor for bypassing current noise is further provided between the voltage output point of said temperature compensated circuit and ground, an impedance at a frequency lower than the oscillation frequency being sufficiently low so as to be capable of bypassing electrical-current noise generated from said first resistor and said second resistor to ground.

12. A temperature compensated piezoelectric oscillator according to claim 11, wherein the self-resonant frequency of said current-noise bypassing capacitor is lower than the oscillation frequency.

13. A temperature compensated piezoelectric oscillator according to claim 11, wherein said temperature compensated piezoelectric oscillator defines a reference signal source of a PLL circuit, and in said current-noise bypassing capacitor, the impedance at a frequency lower than a loop bandwidth of said PLL circuit is sufficiently low so as to be capable of bypassing electrical-current noise to ground.

14. An electronic device comprising a temperature compensated piezoelectric oscillator according to claim 11.

* * * * *